US010949117B2

(12) United States Patent
Ross (10) Patent No.: US 10,949,117 B2
(45) Date of Patent: Mar. 16, 2021

(54) DIRECT DATA TRANSFER IN MEMORY AND BETWEEN DEVICES OF A MEMORY MODULE

(71) Applicant: Micron Technology, Inc., Boise, ID (US)

(72) Inventor: Frank F. Ross, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/139,935

(22) Filed: Sep. 24, 2018

(65) Prior Publication Data

US 2020/0097208 A1 Mar. 26, 2020

(51) Int. Cl.
*G06F 3/06* (2006.01)
*G06F 13/16* (2006.01)
*G11C 11/4093* (2006.01)

(52) U.S. Cl.
CPC .......... *G06F 3/0655* (2013.01); *G06F 3/0679* (2013.01); *G06F 13/1668* (2013.01); *G11C 11/4093* (2013.01)

(58) Field of Classification Search
CPC .. G06F 3/0655; G06F 3/0679; G06F 13/1668; G11C 11/4093
See application file for complete search history.

(56) References Cited

U.S. PATENT DOCUMENTS 4,554,627 A * 11/1985 Holland ............... G06F 9/26
711/E12.017
5,377,325 A * 12/1994 Chan .................. G06F 13/4243
710/29
6,145,042 A * 11/2000 Walton ................. G06F 3/0611
710/107
7,978,557 B2 * 7/2011 Matsui ................. G11C 7/1075
365/221
8,355,294 B2 * 1/2013 Makwana ........... G06F 13/1689
365/233.19

(Continued)

FOREIGN PATENT DOCUMENTS

JP 02022748 A * 1/1990

OTHER PUBLICATIONS

International Search Report and Written Opinon for related PCT Application No. PCT/US2019/049006, dated Dec. 20, 2020, 13 pages.

*Primary Examiner* — Vanthu T Nguyen
(74) *Attorney, Agent, or Firm* — Brooks, Cameron & Huebsch, PLLC (57) ABSTRACT

The present disclosure includes apparatuses and methods related to direct data transfer in memory. An example apparatus can include a first number of memory devices coupled to a host via a respective first number of ports and a second number of memory devices coupled to the first number of memory device via a respective second number of ports, wherein first number of memory devices and the second number of memory devices are configured to transfer data based on a first portion of a command including instructions to read the data from first number of memory devices and send the data directly to the second number of devices and a second portion of the command that includes instructions to write the data to the second number of memory devices.

25 Claims, 5 Drawing Sheets

(56) References Cited

U.S. PATENT DOCUMENTS

| | | | |
|---|---|---|---|
| 8,874,831 B2* | 10/2014 | Lee | G06F 12/0246 |
| | | | 711/103 |
| 9,569,144 B2* | 2/2017 | Uematsu | G11C 5/04 |
| 9,767,903 B2* | 9/2017 | Cho | G11C 14/0018 |
| 10,019,367 B2* | 7/2018 | O | G06F 12/0864 |
| 10,380,022 B2* | 8/2019 | Lee | G06F 12/0871 |
| 2009/0193058 A1 | 7/2009 | Reid | |
| 2009/0210758 A1 | 8/2009 | Huang et al. | |
| 2010/0281131 A1* | 11/2010 | HesselBarth | H04L 12/40013 |
| | | | 709/213 |
| 2012/0110244 A1 | 5/2012 | Feeley et al. | |
| 2015/0127890 A1* | 5/2015 | Brainard | G06F 13/1694 |
| | | | 711/103 |
| 2015/0234601 A1 | 8/2015 | Tsai et al. | |
| 2017/0075576 A1 | 3/2017 | Cho | |
| 2017/0242593 A1 | 8/2017 | Riley et al. | |
| 2017/0371776 A1 | 12/2017 | Riley et al. | |
| 2018/0004422 A1 | 1/2018 | Riley et al. | |
| 2018/0121106 A1* | 5/2018 | Kim | G06F 3/0679 |
| 2018/0181494 A1 | 6/2018 | Malladi et al. | |
| 2018/0225235 A1 | 8/2018 | Lee | |
| 2018/0246643 A1 | 8/2018 | Jenne et al. | |
| 2018/0246790 A1 | 8/2018 | Sankaranarayanan et al. | |

* cited by examiner

DIRECT DATA TRANSFER IN MEMORY AND BETWEEN DEVICES OF A MEMORY MODULE

TECHNICAL FIELD

The present disclosure relates generally to memory devices, and more particularly, to apparatuses and methods for direct data transfer in memory and between devices of a memory module.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

DETAILED DESCRIPTION

The present disclosure includes apparatuses and methods related to direct data transfer in memory and between devices of a memory module.

A memory system can include a dual in-line memory module (DIMM) having a number of memory devices. For example, a DIMM can be a non-volatile DIMM (NVDIMM) that includes a number of non-volatile memory devices. A DIMM can execute commands to transfer data between the host and the non-volatile memory device and between non-volatile memory devices. The commands can be received by the DIMM from another device, such as a host, and/or can be generated by a controller on the DIMM.

For example, a first number of non-volatile memory devices can be coupled to another device, such as a host, via a first port (e.g., an A Side Port) and be coupled to a controller on the DIMM via a second port (e.g., a B Side Port). A second number of non-volatile memory devices can be coupled to the controller on the DIMM. The DIMM can execute commands to transfer data between another device, such as a host, and the first number of non-volatile memory devices via an A Side Port and the DIMM can execute commands to transfer data between the first number of non-volatile memory devices and the second number of non-volatile memory devices via a B Side Port. The DIMM can execute the commands to transfer data between another device and the first number of non-volatile memory devices while executing the commands to transfer data between the first number of non-volatile memory device and the second number of non-volatile memory devices.

The DIMM can send a read command to the first number of non-volatile memory devices. The first number of non-volatile memory devices can read the data associated with the read command and send the data to the second number of non-volatile memory devices on a bus that directly couples the first number of non-volatile memory device and the second number of non-volatile memory devices. The DIMM can send a write command to the second number of memory devices. The second number of non-volatile memory devices can write the data received from the first number of non-volatile memory devices to the second number of non-volatile memory devices in response to receiving the write command.

The DIMM can send a read command to the second number of memory devices. The second number of non-volatile memory devices can read the data associated with the read command and send the data to a host on a bus that directly couples the second number of non-volatile memory devices and the host.

The DIMM can include a number of embodiments where a port is not used to couple the first number of non-volatile memory devices to other devices and/or the controller (e.g., a bus from a host and/or controller is coupled directly to the non-volatile memory devices). The DIMM can send a ready/wait signal to another device, such as a host, indicating whether or not the DIMM is ready to receive commands from the another device. For example, the DIMM can send a ready/wait signal to a host indicating the DIMM is not ready to receive commands from the host and is busy executing commands to transfer data between the memory devices on the DIMM. The DIMM can send a ready/wait signal to a host indicating the DIMM is ready to receive commands from the host when the DIMM is not busy executing commands to transfer data between the memory device on the DIMM.

An example apparatus can include a first number of memory devices coupled to a host via a respective first number of ports and a second number of memory devices coupled to the first number of memory device via a respective second number of ports, wherein first number of memory devices and the second number of memory devices are configured to transfer data based on a first portion of a command including instructions to read the data from first number of memory devices and send the data directly to the second number of devices and a second portion of the command that includes instructions to write the data to the second number of memory devices.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1A:
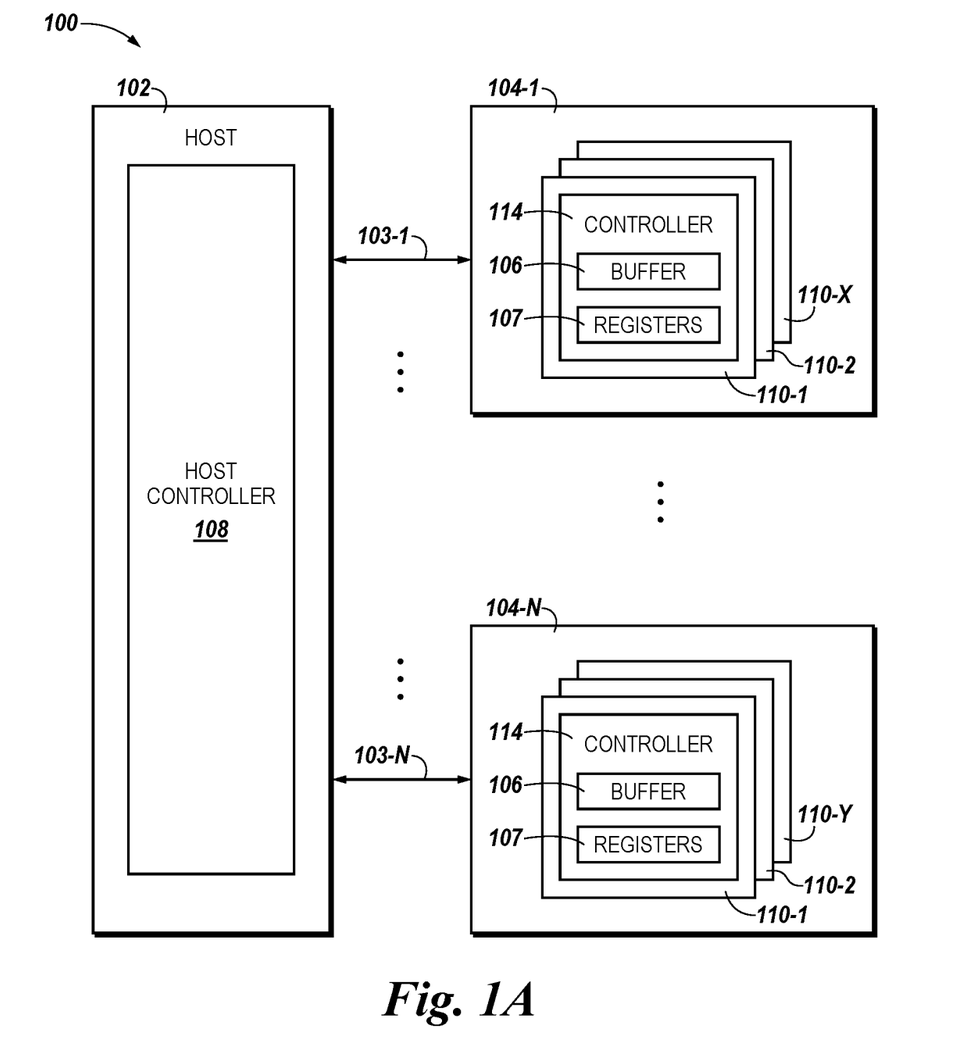
FIG. 1A is a block diagram of an apparatus in the form of a computing system including a memory system in accordance with a number of embodiments of the present disclosure.

FIG. 1A is a functional block diagram of a computing system 100 including an apparatus in the form of a number of memory systems 104-1 ... 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 ... 104-N can include a one or more dual in-line memory modules (DIMM) 110-1, ..., 110-X, 110-Y. The DIMMs 110-1, ..., 110-X, 110-Y can include volatile memory and/or non-volatile memory. In a number of embodiments, memory systems 104-1, ..., 104-N can include a multi-chip device. A multi-chip device can include a number of different memory types and/or memory modules. For example, a memory system can include non-volatile or volatile memory on any type of a module. The examples described below in association with FIGS. 1A-5 use a DIMM as the memory module, but the embodiments of the present disclosure can be used on any memory system that include volatile and/or non-volatile memory. In FIG. 1A, memory system 104-1 is coupled to the host via channel 103-1 can include DIMMs 110-1, ..., 110-X, where DIMM 110-1 is a NVDIMM and 110-X is DRAM DIMM. In this example, each DIMM 110-1, ..., 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, ..., 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 ... 104-N. In a number of embodiments, each memory system 104-1 ... 104-N can be coupled to host 102 via a channel (e.g., channels 103-1, ..., 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 ... 104-N. The host controller 108 can send commands to the DIMMs 110-1, ..., 110-X, 110-Y via channels 103-1 ... 103-N. The host controller 108 can communicate with the DIMMs 110-1, ..., 110-X, 110-Y and/or the controller 114 on each of the DIMMs 110-1, ..., 110-X, 110-Y to read, write, and erase data, among other operations. A physical host interface can provide an interface for passing control, address, data, and other signals between the memory systems 104-1 ... 104-N and host 102 having compatible receptors for the physical host interface. The signals can be communicated between 102 and DIMMs 110-1, ..., 110-X, 110-Y on a number of buses, such as a data bus and/or an address bus, for example, via channels 103-1 ... 103-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) and/or a field programmable gate array (FPGA) coupled to a printed circuit board including a physical interface. Also, each DIMM 110-1, ..., 110-X, 110-Y can include buffers 116 of volatile and/or non-volatile memory and registers 107. Buffer 106 can be used to buffer data that is used during execution of commands.

The DIMMs 110-1, ..., 110-X, 110-Y can provide main memory for the memory system or could be used as additional memory or storage throughout the memory system. Each DIMM 110-1, ..., 110-X, 110-Y can include one or more arrays of memory cells on memory dies, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 1B:
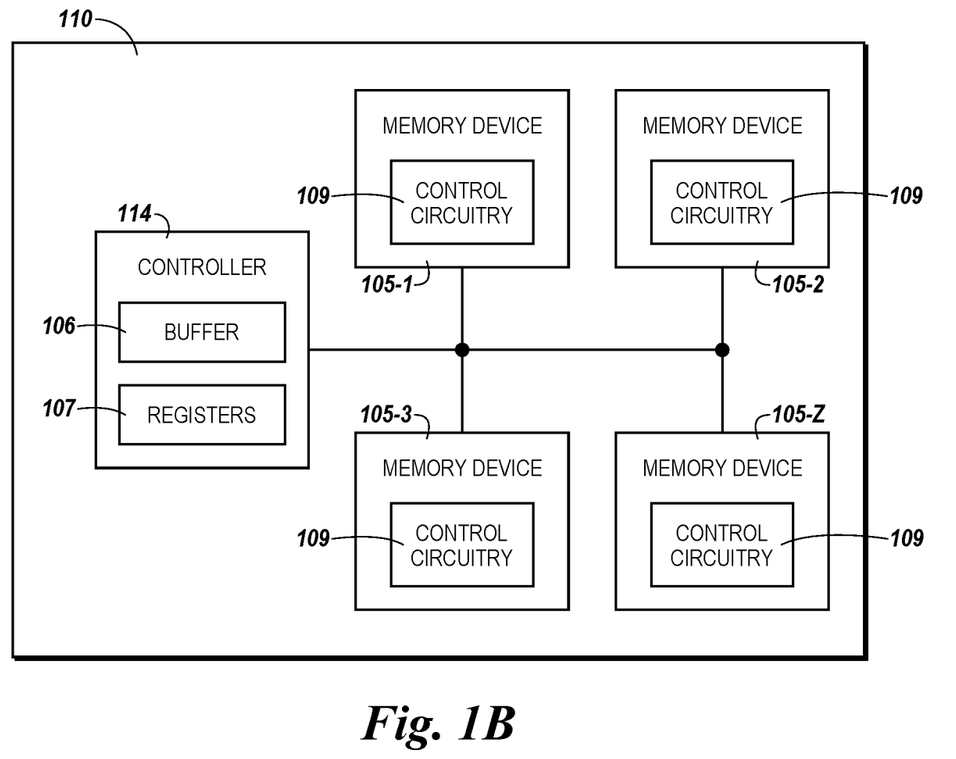
FIG. 1B is a block diagram of an apparatus in the form of a dual in-line memory modules (DIMM) in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include a controller 114. Controller 114 can include memory, such as SRAM memory, that can be a buffer 106 and/or a number of registers 107. DIMM 110 can include a number of memory devices 105-1, . . . , 105-Z coupled to the controller. Memory devices 105-1, . . . , 105-Z can be volatile and/or non-volatile memory devices, such as memory devices 221 and 224 in FIG. 2, and include non-volatile memory arrays and/or volatile memory arrays. Memory devices 105-1, . . . , 105-Z can include control circuitry 109 (e.g., hardware, firmware, and/or software) which can be used to execute commands on the memory devices 105-1, . . . , 105-Z. The control circuitry 109 can receive commands from controller 114. The control circuitry 109 can be configured to execute commands to read and/or write data in the memory devices 105-1, . . . , 105-Z.

Figure 2:
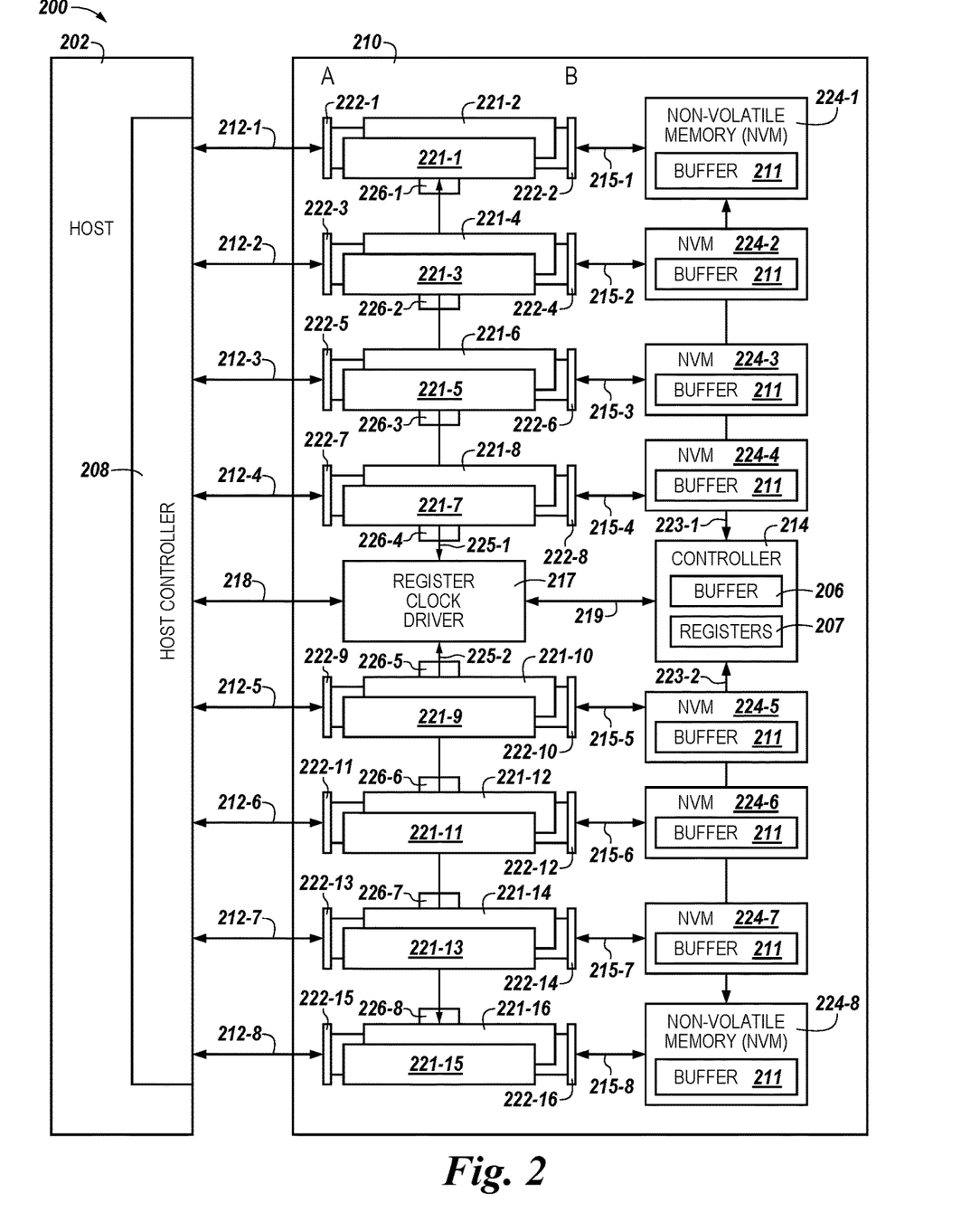
FIG. 2 is a block diagram of a computing system including a host and a memory system comprising a dual in-line memory module (DIMM) with ports in accordance with a number of embodiments of the present disclosure.

FIG. 2 is a block diagram of a computing system 200 including a host 202 and a memory system comprising a dual in-line memory module (DIMM) 210 with ports in accordance with a number of embodiments of the present disclosure. In FIG. 2, host 202 is coupled to DIMM 210 via data buses 212-1, . . . , 212-8 and command/address bus 218. Host 202 can be coupled to DIMM 210 via a number of channels (e.g., channels 103-1, . . . , 103-N in FIG. 1A). For example, host 202 is coupled to DIMM 210 via a first channel that includes data buses 212-1, . . . , 212-4 and command/address bus 218 and host 202 is coupled to DIMM 210 via a second channel that includes data buses 212-5, . . . , 212-8 and command address/bus 218. Host 202 can send commands on the first channel for execution on memory devices 221-1, . . . , 221-8 and memory devices 224-1, . . . , 224-4 and can send commands on the second channel for execution on memory devices 221-9, . . . , 221-16 and memory devices 224-5, . . . , 224-8. Controller 214 can receive commands from host 202. The commands from host 202 can be to read and/or write data to DIMM 210. Controller 214 can interpret the command from host 202 by sending read and/or write commands to memory devices 221-1, . . . , 221-16 and 224-1, . . . , 224-8 to read, write, and transfer data on DIMM 210. The commands from host 202 can be sent to register clock driver (RCD) 217 via bus 218 and the commands can be sent from RCD 217 to controller 214 via bus 219. The controller 214 can receive the commands from RCD 217 and store data associated with the commands (e.g., command instructions and/or data read from and/or to be written to memory devices 221 and/or 224 during execution of the commands) in buffer 206.

Controller 214 can send commands to memory devices 221-1, . . . , 221-8 on bus 225-1 via bus 219 and RCD 217. Controller 214 can send commands to memory devices 221-9, . . . , 221-16 on bus 225-2 via bus 219 and RCD 217. The commands from controller 214 to memory devices 221-1, . . . , 221-16 can include read commands to read data from memory devices 221-1, . . . , 221-16 and send the data directly (e.g., without sending the data to the controller and then to the memory devices) to memory devices 224-1, . . . , 224-8 on buses 215-1, . . . , 215-8 and/or send the data directly to host 202 on buses 212-1, . . . 212-8. The commands from controller 214 to memory devices 221-1, . . . , 221-16 can include write commands to write data to memory devices 221-1, . . . , 221-16 that is received directly from memory devices 224-1, . . . , 221-8 on buses 215-1, . . . , 215-8 and/or write data to memory devices 221-1, . . . , 221-16 that is received directly from host 202 on buses 212-1, . . . , 212-8. The commands sent by controller 214 to memory devices 221-1, . . . , 221-16 and 224-1, . . . , 224-8 can be sent in response to receiving a command from host 202.

Controller 214 can send a signal to RCD 217 indicating which memory device of a pair of memory devices (e.g., memory device 221-1 or 221-2, for example) will execute the command. The signal can be sent from RCD 217 to multiplexor 226-1, . . . , 226-8 and cause multiplexor 226-1, . . . , 226-8 to select a memory device from a pair of memory devices and couple the selected memory device to RCD 217 via bus 225-1 and/or 225-2. For example, if the command is transferring data via an A side port and the A side port is coupling memory device 221-1 to host 202, while the B side port is coupling memory device 221-2 to controller 214, the signal can indicate to multiplexor 226-1 to couple bus 225-1 to memory device 221-1. The controller can then send the command to memory device 221-1 on bus 225-1 via RCD 217 and memory device 221-1 can execute the command by transferring data between memory device 221-1 and host 202. Memory devices 221-1, . . . , 221-16 can send signals, (e.g., command completion signals) on buses 225-1 and 225-2 to RCD 217 and controller 214 that indicate memory devices 221-1, . . . , 221-16 have completed execution of commands and are ready for additional commands. Once a command has been executed, controller 214 can send another command to RCD 217 for execution and/or a status signal to the host 202 indicating that the command received from host 202 has been executed. Controller 214 can include non-volatile and/or volatile memory, such as SRAM memory, that can be a buffer 206 and/or a register 207 used during execution of commands.

Controller 214 can send commands to memory devices 224-1, . . . , 224-4 on bus 223-1 and commands to memory devices 224-5, . . . , 224-8 on bus 223-2. The commands from controller 214 to memory devices 224-1, . . . , 224-8 can include read commands to read data from memory devices 224-1, . . . , 224-8 and send the data directly to memory devices 221-1, . . . , 221-16 on buses 215-1, . . . , 215-8. The commands from controller 214 to memory devices 224-1, . . . , 224-8 can include write commands to write data to memory devices 224-1, . . . , 224-8 received from memory devices 221-1, . . . , 221-16 directly on buses 215-1, . . . , 215-8. Memory devices 224-1, . . . , 224-8 can include buffers 211 to temporarily store data received from memory devices 221-1, . . . , 221-16 when writing the data to memory devices 224-1, . . . , 224-8.

Controller 214 can send read and/or write command to memory devices 224-1, . . . , 224-8 and 221-1, . . . , 221-16 with timing such that the memory devices can execute a write command without latency after completion of a read command. For example, a read command can be sent to memory device 224-1. Memory device 224-1 can execute the read command and send the data associated with the read command to memory device 221-1 on bus 215-1. Controller 214 can send a write command to memory device 221-1 at a time such that the memory device 221-1 can execute the write command without latency and as memory device 221-1 is receiving the data from memory device 224-1 on bus 215-1. Memory device 221-1 can receive the write command from controller 214 with timing such that memory device 221-1 can begin execution of the write command in a clock cycle that occurs immediately following completion of the read command and receipt of the data from memory device 224-1.

DIMM 210 can include a first number of memory devices 221-1, . . . , 221-16. For example, memory devices 221-1, . . . , 221-16 can be FeRAM memory devices, among other types of volatile and/or non-volatile memory. The memory devices 221-1, . . . , 221-16 can be paired together. For example, memory devices 221-1 and 221-2 are paired together, coupled to the host via port 222-1 (A Side Port) and buses 212-1 and 212-2, and coupled to memory device 224-1 via port 222-2 (B Side Port) and bus 215-1. Memory devices 221-3 and 221-4 are paired together, coupled to the host via port 222-3 (A Side Port) and bus 212-2, and coupled to memory device 224-2 via port 222-4 (B Side Port) and bus 215-2. Memory devices 221-5 and 221-6 are paired together, coupled to the host via port 222-5 (A Side Port) and bus 212-3, and coupled to memory device 224-3 via port 222-6 (B Side Port) and bus 215-3. Memory devices 221-7 and 221-8 are paired together, coupled to the host via port 222-7 (A Side Port) and bus 212-4, and coupled to memory device 224-4 via port 222-8 (B Side Port) and bus 215-4. Memory devices 221-9 and 221-10 are paired together, coupled to the host via port 222-9 (A Side Port) and bus 212-5, and coupled to memory device 224-5 via port 222-10 (B Side Port) and bus 215-5. Memory devices 221-11 and 221-12 are paired together, coupled to the host via port 222-11 (A Side Port) and bus 212-6, and coupled to controller 214 via port 222-12 (B Side Port) and bus 215-6. Memory devices 221-13 and 221-14 are paired together, coupled to the host via port 222-13 (A Side Port) and bus 212-7, and coupled to controller 214 via port 222-14 (B Side Port) and bus 215-7. Memory devices 221-15 and 221-16 are paired together, coupled to the host via port 222-15 (A Side Port) and bus 212-8, and coupled to controller 214 via port 222-16 (B Side Port) and bus 215-8.

DIMM 210 can include a second number of memory devices 224-1, . . . , 224-8. For example, memory devices 221-1, . . . , 221-8 can be 3D XPoint memory devices, among other types of volatile and/or non-volatile memory.

Memory system 200 can be configured to execute commands sent from host 202 to DIMM 210 by sending command/address information from the host controller 208 on command/address busses 218 to the register clock driver (RCD) 217 and data on data buses 212-1, . . . , 212-8. The commands from the host can include address information for memory devices 221-1, . . . 221-16 where the host is requesting an operation on data at a particular location in memory devices 221-1, . . . 221-16. The commands from the host can include address information for memory devices 224-1, . . . , 224-8 where the host is requesting an operation on data at particular location in memory devices 224-1, . . . , 224-8, while memory devices 221-1, . . . 221-16 can act as a buffer during execution of the commands.

In a number of embodiments, memory devices 221-1, . . . 221-16 can be configured as cache. For example, memory devices can be configured as cache for the data stored in memory devices 224-1, . . . , 224-8 and/or other memory devices coupled to the computing system. The DIMM 210 can be configured to have a portion of memory devices 221-1, . . . 221-16 addressable by host 202 and a portion of the memory devices 221-1, . . . 221-16 configured as cache.

DIMM 210 includes memory devices that are paired together and one of the paired memory devices can be selected for coupling to host 202 via an A Side Port and the other of the paired memory device can be selected for coupling to controller 214 via a B Side Port. For example, memory devices 221-1, which is paired with memory device 221-2, can be selected for coupling to host 202 via port 222-1, while memory device 221-2 can be selected for coupling to controller 214 via port 222-2. Port 222-1 can include a multiplexor to select and couple memory device 221-1 to host 202 while isolating memory device 221-2 from host 202. Port 222-2 can include a multiplexor to select and couple memory device 221-2 to controller 214 while isolating memory device 221-1 from controller 214. Host 202 can send command to DIMM 210 for execution on the selected A Side Port memory device (e.g., memory device 221-1). The commands can be executed by transferring data between host 202 and memory device 221-1 via port 222-1 on buses 212-1 and/or 212-2. DIMM 210 can also execute commands for execution on the selected B Side Port memory device (e.g., memory device 221-2). The commands can be executed by transferring data between memory device 221-2 and other memory devices via port 222-1 and controller 214 on buses 212-1, 212-2, 223-1, and/or 223-2. Commands executed using the B Side Port can transfer data between memory devices 221-1, . . . , 221-16 and/or between memory devices 221-1, . . . , 221-16 and memory devices 224-1, . . . , 224-8. Ports 222-1, . . . , 22-16 can be external to memory devices 221-1, . . . , 221-16 as illustrated in FIG. 2 and/or internal to memory devices 221-1, . . . , 221-16.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 224-1, . . . , 224-8. For example, after A Side Port and B Side Port transfers have occurred on a pair of memory devices and DIMM 210 is idle, controller 214 can send commands to reconcile the data stored on the pair of memory devices so that the same data is stored on each of the memory devices by transferring data between the pair of memory devices and/or between the pair of memory devices and memory devices 224-1, . . . , 224-8.

In a number of embodiments, commands can be received from host 202 and/or generated by controller 214 to transfer data between memory devices 224-1, . . . , 224-8. Data can be transferred between memory devices 224-1, . . . , 224-8 via controller 214 using buffer 206 and/or registers 207.

Figure 3:
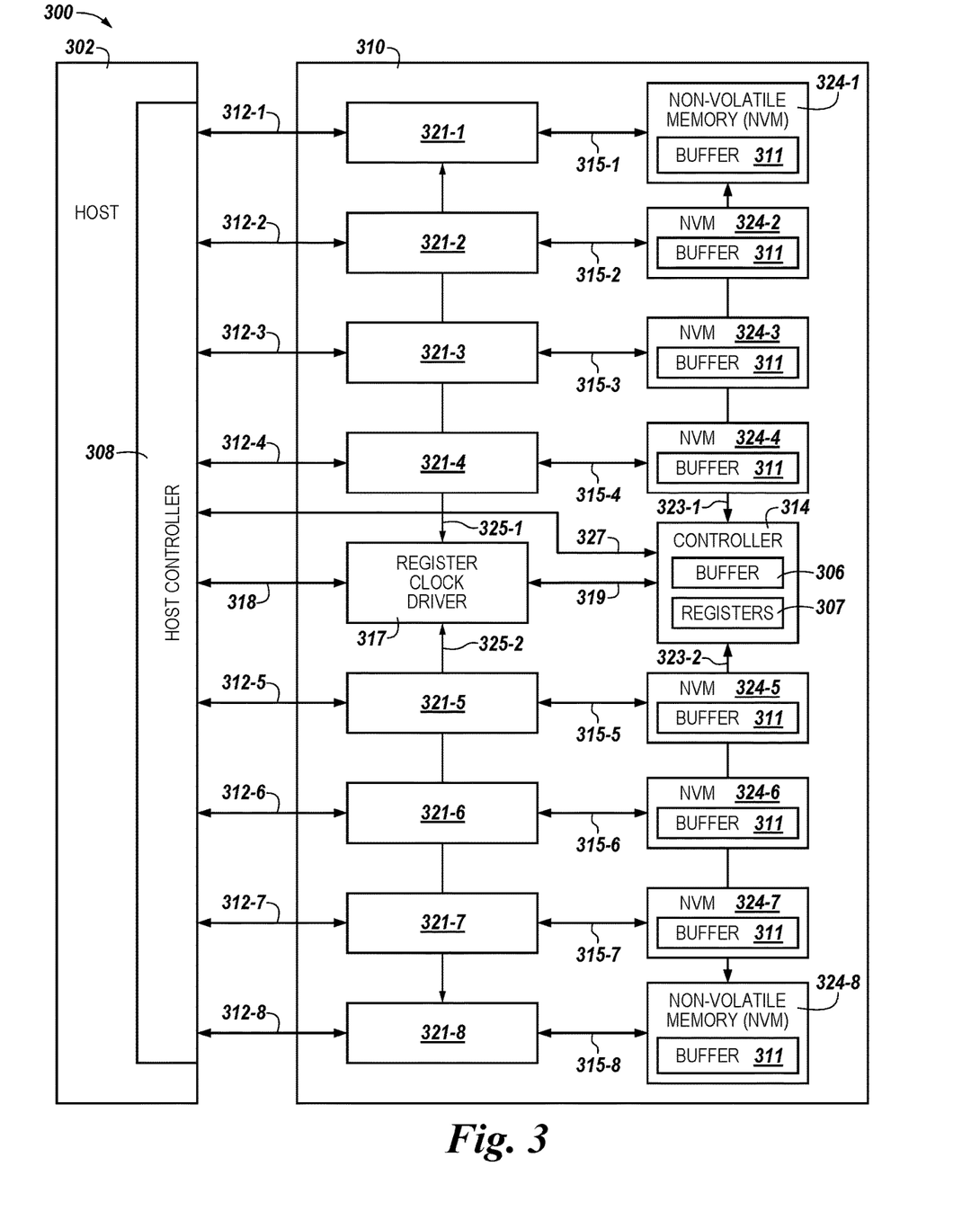
FIG. 3 is a block diagram of a computing system including a host and a memory system comprising a dual in-line memory module (DIMM) with a ready/busy bus in accordance with a number of embodiments of the present disclosure.

FIG. 3 is a block diagram of a computing system 300 including a host 302 and a memory system comprising a dual in-line memory module (DIMM) 310 with a ready/busy bus in accordance with a number of embodiments of the present disclosure. In FIG. 3, host 302 is coupled to DIMM 310 via data buses 312-1, . . . , 312-8, command/address bus 318, and ready/busy bus 327. Host 302 can be coupled to DIMM 310 via a number of channels (e.g., channels 103-1, . . . , 103-N in FIG. 1A). For example, host 302 is coupled to DIMM 310 via a first channel that includes data buses 312-1, . . . , 312-4, command/address bus 318, and ready/busy bus 327; and host 302 is coupled to DIMM 310 via a second channel that includes data buses 312-5, . . . , 312-8, command address/bus 318, and ready/busy bus 327.

DIMM 310 can include a first number of memory devices 321-1, . . . , 321-8. For example, memory devices 321-1, . . . , 321-16 can be FeRAM memory devices, among other types of volatile and/or non-volatile memory. DIMM 310 can include a second number of memory devices 324-1, . . . , 324-8. For example, memory devices 321-1, . . . , 321-8 can be 3D XPoint memory devices, among other types of volatile and/or non-volatile memory.

Controller 314 can send a ready/busy signal to host 302 on the ready/busy bus 327. The ready/busy signal can indicate to host 302 whether or not the controller is ready to receive commands from host 302. For example, if DIMM 310 is busy executing commands, such as transferring data between memory devices 321-1, . . . , 321-4 and memory devices 324-1, . . . , 324-4, for example, the DIMM and is not ready to receive commands, so a ready/busy signal can be sent on ready/busy bus 327 to host 302 that indicates DIMM 310 is not ready to receive commands. Once DIMM 310 is no longer busy executing commands DIMM 310 can send a ready/busy signal on ready/busy bus 327 to host 302 indicating DIMM 310 is ready to receive commands from host 302. Host 302 can send commands to DIMM 310 in response to receiving the ready/busy signal.

Controller 314 can receive commands from host 302. The commands from host 302 can be to read and/or write data to DIMM 310. Controller 314 can interpret the command from host 302 by sending read and/or write commands to memory devices 321-1, . . . , 321-8 and 324-1, . . . , 324-8 to read, write, and transfer data on DIMM 310. The commands from host 302 can be sent to register clock driver (RCD) 317 via bus 318 and the commands can be sent from RCD 317 to controller 314 via bus 319. Controller 314 can receive the commands from RCD 317 and store data associated with the commands (e.g., command instructions and/or data read from and/or to be written to memory devices 321 and/or 324 during execution of the commands) in buffer 306. The controller can send the commands to memory devices 321-1, . . . , 321-8 on bus 325-1 and/or 325-2 via RCD 317 and memory devices 321-1, . . . , 321-8 can execute the commands by transferring data between memory devices 321-1, . . . , 321-8 and host 302 and/or memory devices 321-1, . . . , 321-8 and memory device 324-1, . . . , 324-8. Memory devices 321-1, . . . , 321-8 can send signals on buses 325-1 and 325-2 to RCD 317 and controller 314 that indicate memory devices 321-1, . . . , 321-8 have completed execution of commands and are ready for additional commands. Once a command has been executed, controller 314 can send a status signal to the host 302 indicating that the command received from host 302 has been executed. Controller 314 can include non-volatile and/or volatile memory, such as SRAM memory, that can be a buffer 306 and/or a register 307 used during execution of commands.

Controller 314 can send commands to memory devices 321-1, . . . , 321-4 on bus 325-1 via bus 319 and RCD 317. Controller 314 can send commands to memory devices 321-5, . . . , 321-8 on bus 325-2 via bus 319 and RCD 317. The commands from controller 314 to memory devices 321-1, . . . , 321-8 can include read commands to read data from memory devices 321-1, . . . , 321-8 and send the data directly to memory devices 324-1, . . . , 324-8 on buses 315-1, . . . , 315-8 and/or send the data directly to host 302 on buses 312-1, . . . 312-8. The commands from controller 314 to memory devices 321-1, . . . , 321-8 can include write commands to write data to memory devices 321-1, . . . , 321-8 that is received directly from memory devices 324-1, . . . , 324-8 on buses 315-1, . . . , 315-8 and/or write data to memory devices 321-1, . . . , 321-8 that is received directly from host 302 on buses 312-1, . . . , 312-8. The commands sent by controller 314 to memory devices 321-1, . . . , 321-8 and 324-1, . . . , 324-8 can be sent in response to receiving a command from host 302.

Controller 314 can send commands to memory devices 324-1, . . . , 324-4 on bus 323-1 and commands to memory devices 324-5, . . . , 324-8 on bus 323-2. The commands from controller 314 to memory devices 324-1, . . . , 324-8 can include read commands to read data from memory devices 324-1, . . . , 3-8 and send the data directly to memory devices 321-1, . . . , 321-8 on buses 315-1, . . . , 315-8. The commands from controller 314 to memory devices 324-1, . . . , 324-8 can include write commands to write data to memory devices 324-1, . . . , 324-8 received from memory devices 321-1, . . . , 321-8 directly on buses 315-1, . . . , 315-8. Memory devices 324-1, . . . , 324-8 can include buffers 311 to temporarily store data received from memory devices 321-1, . . . , 321-8 when writing the data to memory devices 324-1, . . . , 324-8.

Controller 314 can send read and/or write command to memory devices 324-1, . . . , 324-8 and 321-1, . . . , 321-8 with timing such that the memory devices can execute a write command without latency after completion of a read command. For example, a read command can be sent to memory device 324-1. Memory device 324-1 can execute the read command and send the data associated with the read command to memory device 321-1 on bus 315-1. Controller 314 can send a write command to memory device 321-1 at a time such that the memory device 321-1 can execute the write command without latency and as memory device 321-1 is receiving the data from memory device 324-1 on bus 3-1. Memory device 321-1 can receive the write command from controller 314 with timing such that memory device 321-1 can begin execution of the write command in a clock cycle that occurs immediately following completion of the read command and receipt of the data from memory device 324-1.

Memory system 300 can be configured to execute commands sent from host 302 to DIMM 310 by sending command/address information from the host controller 308 on command/address bus 318 to the register clock driver (RCD) 317 and data on data buses 312-1, . . . , 312-8. The commands from the host can include address information for memory devices 321-1, . . . 321-8 where the host is requesting an operation on data at particular location in memory devices 321-1, . . . 321-16. The commands from the host can include address information for memory devices 324-1, . . . , 324-4 where the host is requesting an operation on data at particular location in memory devices 324-1, . . . , 324-4, while memory devices 321-5, . . . 321-8 can act as a buffer during execution of the commands.

In a number of embodiments, memory devices 321-1, . . . 321-8 can be configured as cache. For example, memory devices can be configured as cache for the data stored in memory devices 324-1, . . . , 324-8 and/or other memory devices coupled to the computing system. The DIMM 310 can be configured to have a portion of memory devices 321-1, . . . 321-8 addressable by host 302 and a portion of the memory devices 321-1, . . . 321-8 configured as cache.

In a number of embodiments, commands can be received from host 302 and/or generated by controller 314 to transfer data between memory devices 324-1, . . . , 324-8. Data can be transferred between memory devices 324-1, . . . , 324-8 via controller 314 using buffer 306 and/or registers 307.

Figure 4:
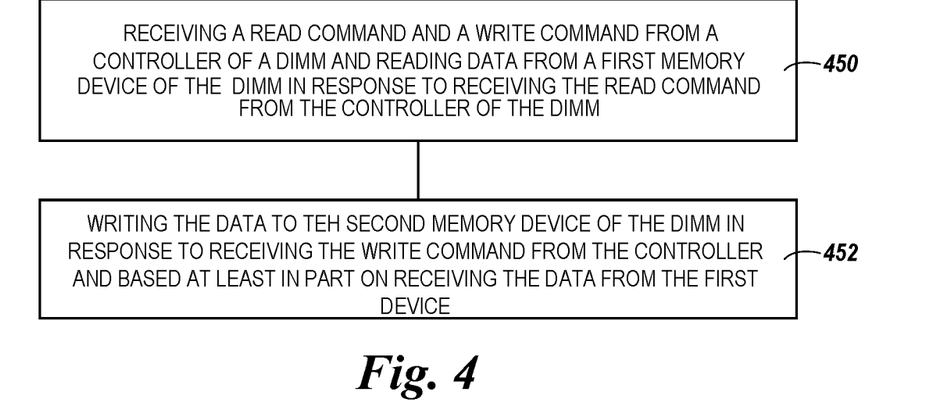
FIG. 4 is a flow diagram illustrating an example memory process including direct data transfer in memory in accordance with a number of embodiments of the present disclosure.

FIG. 4 is a flow diagram illustrating an example memory process including direct data transfer in memory in accordance with a number of embodiments of the present disclosure. The process described in FIG. 4 can be performed by, for example, a memory system including a NVDIMM such as DIMM 210 shown in FIG. 2.

At block 450, the process can include receiving a read command from a controller of a dual in-line memory module (DIMM); receiving a write command from the controller of the DIMM; and reading data from a first memory device of the DIMM in response to receiving the read command from the controller of the DIMM.

At block 452, the process can include writing the data to the second memory device of the DIMM in response to receiving the write command from the controller and based at least in part on receiving the data from the first memory device.

Figure 5:
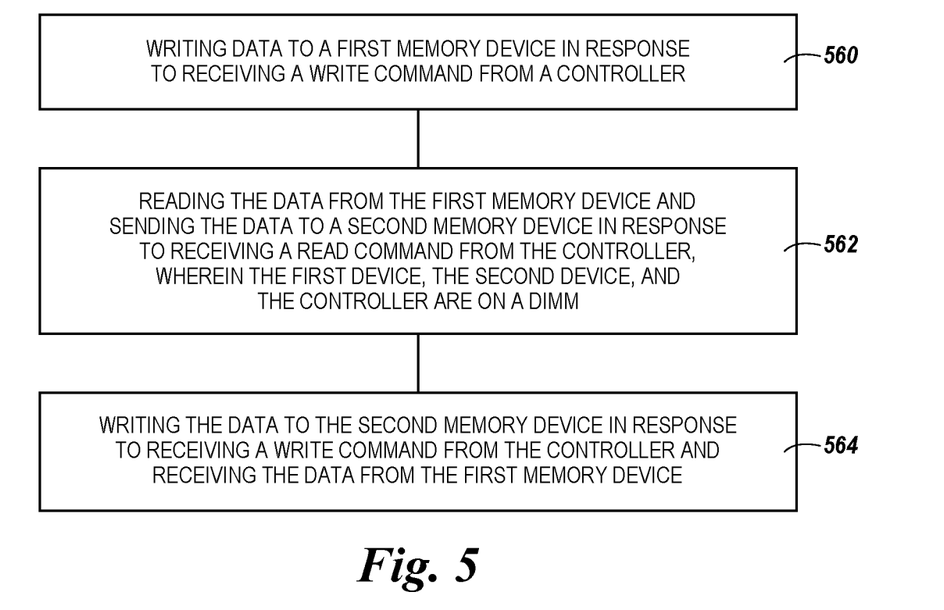
FIG. 5 is a flow diagram illustrating an example memory process including direct data transfer in memory in accordance with a number of embodiments of the present disclosure.

FIG. 5 is a flow diagram illustrating an example memory process including direct data transfer in memory in accordance with a number of embodiments of the present disclosure. The process described in FIG. 5 can be performed by, for example, a memory system including a NVDIMM such as DIMM 210 shown in FIG. 2.

At block 560, the process can include writing data to a first memory device in response to receiving a write command from a controller.

At block 562, the process can include reading the data from the first memory device and sending the data to a second memory device in response to receiving a read command from the controller, wherein the first device, the second device, and the controller are on a dual in-line memory module (DIMM).

At block 564, the process can include writing the data to the second memory device in response to receiving a write command from the controller and receiving the data from the first memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a pair of a first number of memory devices coupled to a host via a respective first number of ports; and
a second number of memory devices coupled to the first number of memory device via a respective second number of ports and to a controller via a respective third number of ports, wherein:
a first memory device of the pair of the first number of memory devices are configured to transfer, based on a first portion of a command received from the controller and including instructions to read data from first number of memory devices, the data directly to the second number of devices;
a second memory device of the pair of the first number of memory device are configured to transfer, based on the first portion of the command received from the controller and including instructions to read data from the first number of memory device, the data directly to the host while the first memory device of the pair of the first number of memory devices transfers the data directly to the second number of devices; and
a second portion of the command includes instructions to write the data to the second number of memory devices, wherein the second portion of the command is executed with timing such that second memory device begins execution of the second portion of the command in a clock cycle that occurs immediately following completion of the read command.

2. The apparatus of claim 1, wherein the first number of memory devices are configured to receive the first portion of the command from the controller via a register clock driver (RCD).

3. The apparatus of claim 1, wherein the second number of devices are configured to receive the second portion of the command from the controller.

4. The apparatus of claim 1, wherein the second number of devices are configured to execute the second portion of the command in response to the first number of memory devices executing the first portion of the command.

5. The apparatus of claim 1, wherein the first number of memory devices are configured to receive the first portion of the command from the controller prior to the second number of memory devices receiving the second portion of the command from the controller.

6. The apparatus of claim 1, wherein the first number of memory devices are FeRAM memory devices.

7. The apparatus of claim 1, wherein the second number of memory devices are FeRAM memory devices.

8. The apparatus of claim 1, wherein the memory device is a dual in-line memory module (DIMM).

9. An apparatus, comprising:
a memory module, wherein the memory module includes a first memory device coupled to a second memory device via a first bus, wherein the first memory device is coupled to a controller via a second bus and the second memory device is coupled to the controller via a third bus, wherein the memory module is coupled to a host, and wherein the controller on the memory module is configured to:
receive a command from the host including instructions to transfer data from the first memory device;
send a read command to the first memory device instructing the first memory device to transfer the data from the first memory device directly to the second memory device; and
send a write command to the second memory device instructing the second memory device to write the data received directly from the first memory device to the second memory device, wherein the write command is executed with timing such that second memory device begins execution of the write command in a clock cycle that occurs immediately following completion of the read command.

10. The apparatus of claim 9, wherein the memory module is configured to transfer data between the first memory device and the host while executing the command.

11. The apparatus of claim 9, wherein the command is received from the host in response to the controller sending a ready/busy signal to the host.

12. The apparatus of claim 9, wherein the write command is executed during a clock cycle that immediately follows completion of the read command.

13. The apparatus of claim 9, wherein the data is transferred on a bus directly from the first memory device to the second memory device transferred directly.

14. The apparatus of claim 9, wherein the controller on the memory module is configured to send another read command to the second memory device instructing the second memory device to transfer the data from the second memory device to the host.

15. A method, comprising:
receiving, via a first bus and at a first memory device, a read command from a controller of a dual in-line memory module (DIMM);
receiving, via a second bus and at a second memory device, a write command from the controller of the DIMM, wherein the second memory device is directly coupled to the first memory device via a third bus;
reading data from the first memory device of the DIMM in response to receiving the read command from the controller of the DIMM, wherein the data read from the first memory device is transferred directly to the second memory device via the third bus and to the host via a fourth bus; and
writing the data to the second memory device of the DIMM in response to receiving the write command from the controller and based at least in part on receiving the data from the first memory device, wherein writing the data to the second memory device is completed with timing such that write command is executed in a clock cycle that occurs immediately following completion of the read command.

16. The method of claim 15, further including reading the data from the second memory device and sending the data to a host in response to receiving another read command from the controller.

17. The method of claim 15, further including reading the data from the first memory device and writing the data to the second memory device in response to receiving a read request from a host.

18. The method of claim 15, wherein sending the data to the second memory device includes sending the data from the first memory device to the second memory device on a bus and bypassing other memory devices or controllers coupled to the bus.

19. The method of claim 15, wherein sending the data to the second memory device includes storing the data in a buffer on the second memory device.

20. The method of claim 15, further including transferring other data between the second memory device and a host while reading the data from the first memory device.

21. A method, comprising:
receiving a write command from a controller;
writing data to a first memory device in response to receiving the write command from a controller, wherein the first memory device is coupled to the controller via a first bus;
receiving a read command from the controller;
reading the data from the first memory device and sending the data to a second memory device via a second bus in response to receiving the read command from the controller with timing such that read command is executed in a clock cycle that occurs immediately following completion of the write command, wherein:
the first memory device, the second memory device, and the controller are on a dual in-line memory module (DIMM); and
the first memory device is directly coupled to the second memory device via the second bus; and
writing the data to the second memory device in response to receiving a write command from the controller and based at least in part on receiving the data from the first memory device.

22. The method of claim 21, further including writing the data to the first memory device received from a host.

23. The method of claim 21, further including writing data to a first memory device, reading the data from the first memory device and sending the data to a second memory device, and writing the data to the second memory device in response to receiving a write request from a host.

24. The method of claim 23, further including receiving the write request from the host in response to sending a ready/busy signal from the controller to the host.

25. The method of claim 21, further including writing the data to the first memory device configured as a buffer.

* * * * *